(12) United States Patent
Park et al.

(10) Patent No.: US 8,445,926 B2
(45) Date of Patent: May 21, 2013

(54) LED PACKAGE, METHOD OF FABRICATING THE SAME, AND BACKLIGHT UNIT HAVING THE SAME

(75) Inventors: Jun Seok Park, Gwangju (KR); Yong Seok Choi, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 375 days.

(21) Appl. No.: 11/995,649

(22) PCT Filed: Dec. 28, 2006

(86) PCT No.: PCT/KR2006/005808
§ 371 (c)(1),
(2), (4) Date: Jan. 14, 2008

(87) PCT Pub. No.: WO2007/078103
PCT Pub. Date: Jul. 12, 2007

(65) Prior Publication Data
US 2008/0191231 A1    Aug. 14, 2008

(30) Foreign Application Priority Data

Jan. 6, 2006  (KR) ........................ 10-2006-0001534

(51) Int. Cl.
*H01L 33/00*    (2010.01)
(52) U.S. Cl.
USPC .......... 257/98; 257/99; 257/100; 257/E21.35; 438/22; 438/25; 438/29; 438/106
(58) Field of Classification Search
USPC .................. 257/700, 257, 676, 787, E21.351, 257/98–100, 677, 684, E21.35; 438/28, 22, 438/25, 64, 122–123, 29, 106
See application file for complete search history.

(56) References Cited

U.S. PATENT DOCUMENTS

| | | | |
|---|---|---|---|
| 6,482,664 B1 * | 11/2002 | Lee et al. ...................... | 438/28 |
| 6,670,751 B2 * | 12/2003 | Song et al. .................... | 313/512 |
| 2002/0175621 A1 * | 11/2002 | Song et al. .................... | 313/515 |
| 2004/0021217 A1 * | 2/2004 | Epitaux et al. ................ | 257/700 |
| 2004/0027067 A1 | 2/2004 | Song et al. | |
| 2004/0159850 A1 | 8/2004 | Takenaka | |
| 2004/0264195 A1 * | 12/2004 | Chang et al. .................. | 362/294 |
| 2005/0139846 A1 * | 6/2005 | Park et al. ..................... | 257/98 |
| 2005/0199884 A1 | 9/2005 | Lee et al. | |
| 2006/0002142 A1 | 1/2006 | Jeong et al. | |

FOREIGN PATENT DOCUMENTS

| | | |
|---|---|---|
| EP | 1469707 A2 | 10/2004 |
| JP | 11-45958 A | 2/1999 |
| JP | 2002-162626 A | 6/2002 |
| JP | 2002-353515 A | 12/2002 |
| JP | 2002-368277 A | 12/2002 |
| KR | 10-2005-0060229 A | 6/2005 |
| KR | 10-2005-0089522 A | 9/2005 |

\* cited by examiner

*Primary Examiner* — Evan Pert
*Assistant Examiner* — Mark A Laurenzi
(74) *Attorney, Agent, or Firm* — Birch, Stewart, Kolasch & Birch, LLP

(57) ABSTRACT

Disclosed are a LED package, a method of fabricating the same, and a backlight unit having the same. The light emitting diode package comprises a light emitting diode, a printed circuit board provided with a circuit pattern used for driving the light emitting diode and a through hole formed in an area where the light emitting diode is mounted, and a heat sink provided in the through hole and contacted with a bottom surface of the light emitting diode.

19 Claims, 2 Drawing Sheets

[Fig. 1]
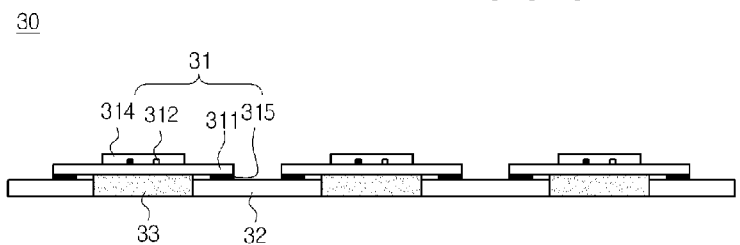
[Fig. 2]
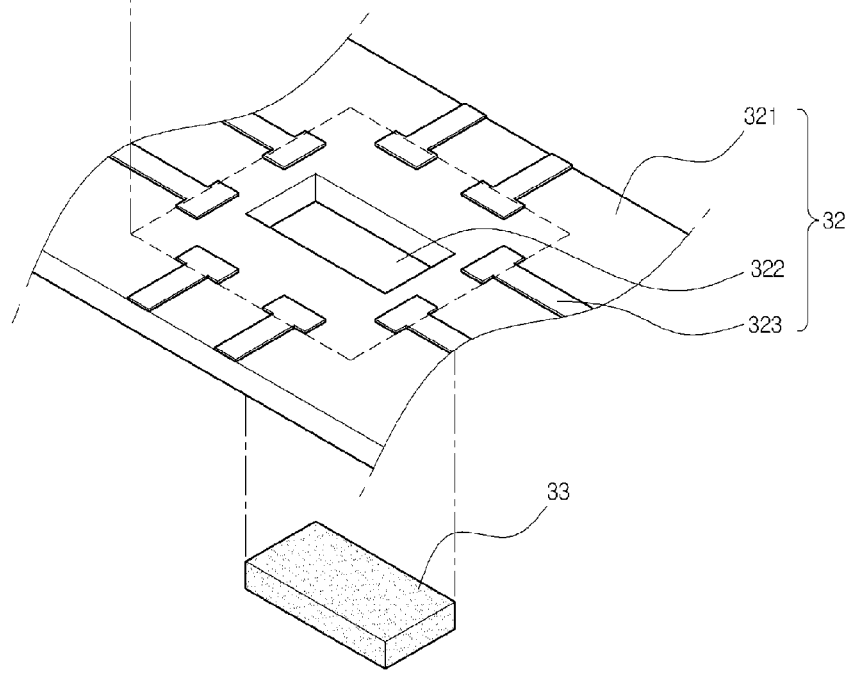
[Fig. 3]
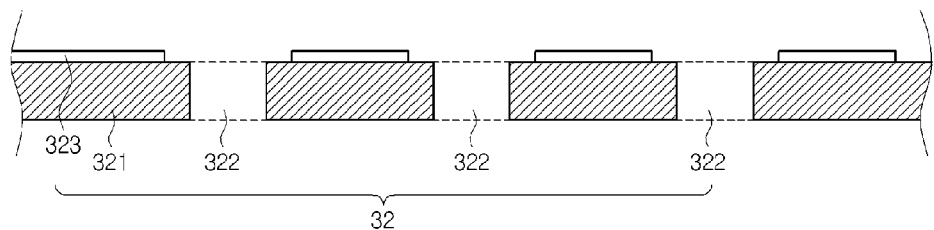

[Fig. 4]
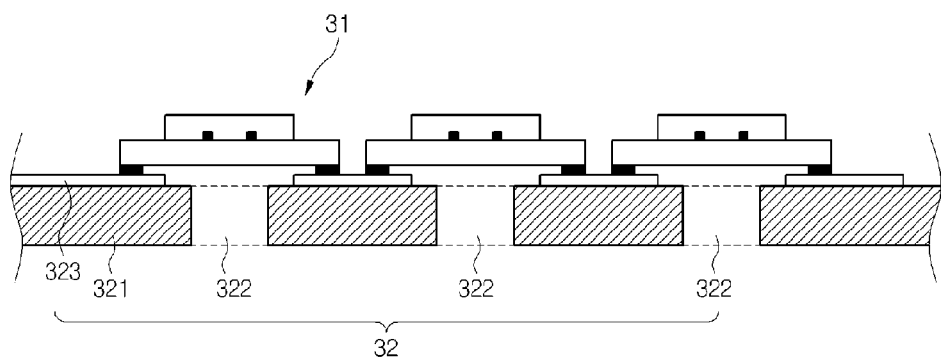
[Fig. 5]
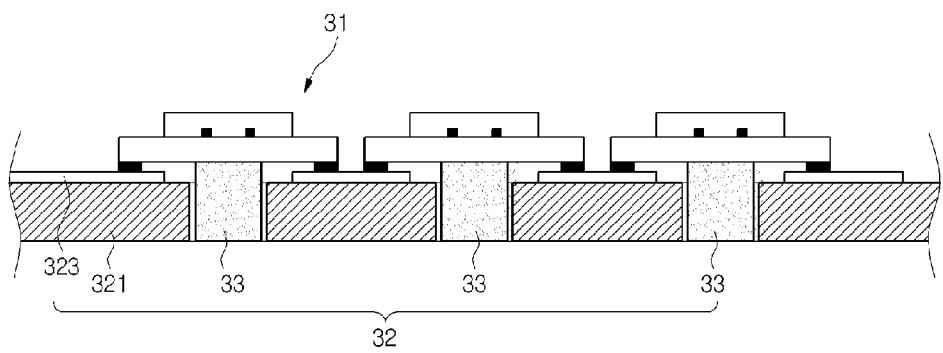
[Fig. 6]
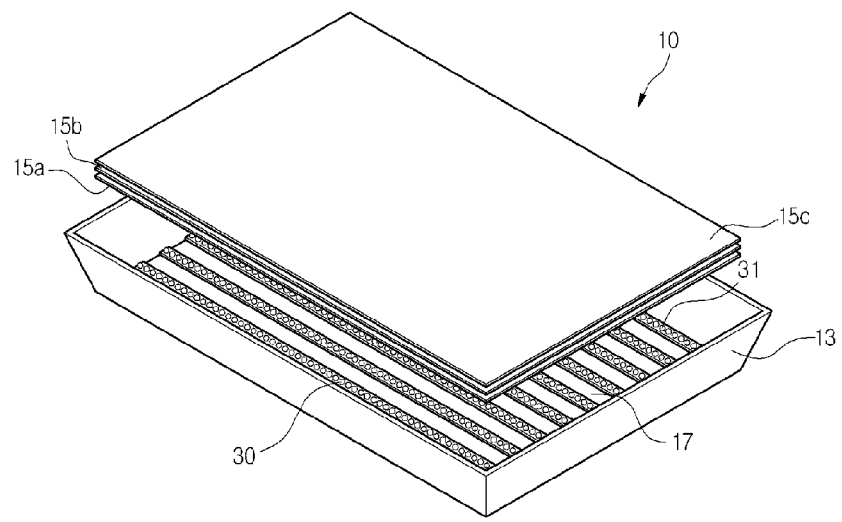

LED PACKAGE, METHOD OF FABRICATING THE SAME, AND BACKLIGHT UNIT HAVING THE SAME

TECHNICAL FIELD

The present invention relates to a light emitting diode (LED) package, a method of fabricating the same, and a backlight unit having the same.

BACKGROUND ART

Liquid crystal display devices (hereinafter, referred to as "LCDs"), which are representative flat panel display devices, include a lower TFT substrate to which transparent pixel electrodes are connected through switching units and an upper color filter substrate formed with common electrodes.

A liquid crystal having an anisotropic characteristic is provided between the substrates of such an LCD, and a backlight unit capable of irradiating light onto the whole area of a screen of the LCD with uniform brightness is required so as to allow pixels of the LCDs to emit light.

Although a cold cathode fluorescent lamp (CCFL) is mainly used as a backlight unit of an LCD, the cold cathode fluorescent lamp (CCFL), which is a side light source, requires elements such as a prism in order to spread light over the entire surface of the LCD. Accordingly, it is difficult to reduce the thickness and costs of the LCD.

For this reason, studies have been performed in relation to a surface light source which irradiates external light onto the entire screen of the LCD with uniform brightness. To this end, a backlight unit using a high-power and high-brightness light emitting diode (LED) has been developed.

In general, a LED package is provided to a side portion of a backlight unit, and light emitted from the LED package is incident onto an LCD positioned above a light guide plate through the light guide plate such that the LCD can serve as a display.

However, the LED of the backlight unit has a light efficiency of about 301 m/W, which is much lower than a light efficiency (about 851 m/W) of the cold cathode fluorescent lamp.

In general, the LED has a light efficiency corresponding to a half or less of a light efficiency of the cold cathode fluorescent lamp. In addition, since energy of the LED that is not used as a light source is converted into heat, a problem of heat generation may occur.

Due to the heat generation, the temperature of the LCD using the LED rises by 10° C. or more as compared with that of an LCD using the cold cathode fluorescent lamp when the LCD operates for a long time.

Accordingly, if heat of the LED is not discharged to an exterior, but continuously accumulated in the LCD, the LCD is deteriorated, so that display quality may be degraded, or colors of the LCD may be changed. In addition, the heat may degrade the endurance and the reliability of the LED.

Further, since a high-brightness and high-power LED is necessary, heat dissipation has been mainly issued as a problem in the LED package.

If the intensity of current increases to obtain high-power light from an LED package, heat having the high temperature may be generated from the LED. If the internal temperature of the LED package rises due to the generated heat, resistance may highly increase so that light efficiency is lowered.

DISCLOSURE

Technical Problem

The embodiment of the present invention provides a light emitting diode package capable of efficiently discharging heat by improving a structure of a printed circuit board.

The embodiment of the present invention provides a backlight unit including a light emitting diode package capable of overcoming the deterioration of the LCD by efficiently dealing with heat radiated from the light emitting diode.

Still the embodiment of the present invention provides a method of fabricating a light emitting diode package, capable of reducing the size and thickness of the light emitting diode package to realize a thin LCD by improving optical power efficiency of a light emitting diode and enhancing heat dissipation efficiency.

Technical Solution

The embodiment of the present invention provides a light emitting diode package comprising a light emitting diode, a printed circuit board provided with a circuit pattern used for driving the light emitting diode and a through hole formed in an area where the light emitting diode is mounted, and a heat sink provided in the through hole and contacted with a bottom surface of the light emitting diode.

The embodiment of the present invention provides a backlight unit comprising a light emitting diode package which includes a light emitting diode, a printed circuit board provided with a circuit pattern driving the light emitting diode, and a through hole formed in an area on which the light emitting diode is mounted, and a heat sink provided in the through hole and contacted with a bottom surface of the light emitting diode, a frame which supports the light emitting diode package such that heat delivered from a heat sink is discharged to an exterior, and an optical sheet which processes light emitted from the light emitting diode package.

The embodiment of the present invention provides a method of fabricating a light emitting diode package, the method comprising the steps of forming a through hole in a light emitting diode mounting area of a printed circuit board provided with a circuit pattern, mounting a light emitting diode on the light emitting diode mounting area, and inserting a heat sink into the through hole of the printed circuit board such that the heat sink makes contact with a bottom surface of the light emitting diode.

Advantageous Effects

According to the embodiment of the present invention, a structure of a printed circuit board is improved such that a light emitting diode package can efficiently discharge heat.

In addition, according to the embodiment of the present invention, it is possible to provide a backlight unit including a light emitting diode package, capable of preventing an LCD from being deteriorated by efficiently dealing with heat generated from a light emitting diode.

Further, according to the embodiment of the present invention, it is possible to provide a method of fabricating a light emitting diode package, capable of reducing the size and thickness of the light emitting diode package to realize a thin LCD by improving optical power efficiency of a light emitting diode and enhancing heat dissipation efficiency.

DESCRIPTION OF DRAWINGS

FIG. 1 is a sectional view showing a light emitting diode package according to an embodiment of the present invention;

FIG. 2 is an exploded perspective view of a light emitting diode package according to an embodiment of the present invention;

FIGS. 3 to 5 are views showing a process of fabricating a light emitting diode package according to an embodiment of the present invention; and FIG. 6 is a view showing a backlight unit equipped with a light emitting diode package according to an embodiment of the present invention.

MODE FOR INVENTION

Hereinafter, a light emitting diode package, a method of fabricating the same, and a backlight unit having the same according to an embodiment of the present invention will be described in detail with reference to accompanying drawings.

It will be understood that when an element is referred to as being on or under another element, it can be directly on or under the element, and one or more intervening elements may also be present.

FIG. 1 is a sectional view showing a light emitting diode package 30 according to an embodiment of the present invention, and FIG. 2 is an exploded perspective view of the light emitting diode package 30.

As shown in FIGS. 1 and 2, the light emitting diode package 30 includes at least one light emitting diode 31, a printed circuit board (PCB) 32, and a heat sink 33 for serving as a heat discharging path to deliver heat radiated from the light emitting diode 31 to an exterior.

The light emitting diode 31 includes light emitting diode chips 312 manufactured using InGaN semiconductors, a chip support member 311 provided with lead frames 313, and a molding part 314 for molding the light emitting diode chip 312 formed on the top surface of the chip support member 311.

The lead frames 313 are formed at a top surface, a side surface, and a bottom surface of the chip support member 311. The lead frames 313 electrically connect the light emitting diode chips 312, which are provided on the top surface of the chip support member 311, to circuit patterns 323 of the printed circuit board 32 positioned under the bottom surface of the chip support member 311.

Although various types of light emitting diodes can be installed in the light emitting diode package according to the embodiment of the present invention, the following description will be made in relation to the chip type light emitting diode 31 as an example.

In addition, the light emitting diode 31 includes at least one light emitting diode chip 312.

As shown in FIGS. 1 and 2, the light emitting diode 31 includes a plurality of light emitting diode chips 312 mounted on the chip support member 311 and electrically connected to the printed circuit board 32 through the lead frames 313. In addition, the light emitting diode 31 includes the round or square type molding part 314 formed on a top surface thereof.

In order to mold the light emitting diode chips 312, an upper portion of the chip support member 311 is transfer-molded using epoxy mold compound (EMC).

The lead frames 313 are provided at a lower portion of the light emitting diode 31 so as to make electrical contact with an exterior. In addition, an electrical connection part 315 is provided at the lower portion of the light emitting diode 31 in order to enable the lead frames 313 to make contact with the circuit pattern 323 of the printed circuit board 32 coated with solder paste.

Meanwhile, as shown in FIG. 2, the printed circuit board 32 according to the embodiment of the present invention includes an insulating layer 321, the circuit patterns 323 corresponding to a power line, a control line, and an output line for operating the light emitting diode 31, which are mounted on the printed circuit board 32, and a through hole 322 extending by passing through upper and lower portions of the insulating layer 321 in an area where the light emitting diode 31 is mounted.

A plurality of through holes 322 may be formed according to installation locations of the light emitting diode 31, and solder pads of the circuit pattern 323 are positioned around the through holes 322 and electrically connected to electrode pads formed at the bottom surface of the light emitting diode 31.

In addition, the through hole 322 may be formed in the flat insulating layer 321 through mechanical drilling, punching, or laser irradiation, and the diameter of the through hole 322 is smaller than the size of the light emitting diode 31 by taking an interval between circuit patterns into consideration.

In this case, when the printed circuit board 32 is manufactured, a scheme of forming the through hole 322 is selected such that the circuit pattern 323 is not peeled or broken.

Those skilled in the art can select a material constituting the insulating layer 321 of the printed circuit board 32 by taking characteristics required for the printed circuit board 32 into consideration, and the present invention does not specifically limit the materials for the insulating layer 321.

For example, a rigid printed circuit board may be manufactured by using a flame retardant type 4 (FR-4) having relatively high dielectric constant (Dk=4.7). In this case, as shown in FIGS. 1 to 4, such a printed circuit board 32 may be formed with the circuit pattern 323 and the through hole 322 such that the light emitting diode chips can be mounted in series or in parallel.

In addition, it is preferred that routing or a solder mask is formed on the upper plate of the FR-4 or epoxy printed circuit board 32 such that light emitting diodes are mounted on the upper plate to perform circuit operation.

The heat sink 33, which includes metal or metal paste allowing heat dissipation, is inserted into the through hole 322. In addition, the heat sink 33 may be bonded to the through hole 322 of the printed circuit board by glue applied to the inside of the through hole 322.

In addition, one end portion of the heat sink 33 may adhere to the bottom surface of the light emitting diode 31.

The heat sink 33 according to the embodiment of the present invention has superior heat conductivity, and may be press-fitted into the through hole 322 or adhere to the through hole 322 by glue. Further, in order to sufficiently discharge heat of the light emitting diode 31 to an exterior, the diameter and the height of the heat sink member 33 are selected such that the heat dissipation efficiency can be improved.

The heat sink 33, which is inserted into the through hole 322 of the printed circuit board 32 in the light emitting diode package 30, includes one of copper, copper alloys, aluminum, and aluminum alloys, and becomes a path capable of vertically discharging heat emitted from the light emitting diode package 30.

In general, although the typical FR-4 or epoxy printed circuit board can be easily designed, manufactured, and modified, and highly integrated at low costs, a heat dissipation characteristic of the FR-4 or epoxy printed circuit board according to the temperature is degraded as compared with that of a metal-core printed circuit board.

However, the printed circuit board 32 according to the embodiment of the present invention is provided with the through hole 322 for exposing the bottom surface of the light emitting diode 31. In addition, the heat sink 33 is inserted into the through hole 322 such that a heat dissipation path capable of discharging heat emitted from the light emitting diode 31 to an exterior is formed in the through hole 322. Accordingly, it is possible to prevent the characteristics of the light emitting diode package from being degraded according to the temperature.

Meanwhile, if the metal-core printed circuit board having a superior heat dissipation characteristic includes the light emitting diode package, heat generated from the light emitting diode is transferred to an entire substrate, so that the heat is conducted even to other light emitting diodes mounted on the printed circuit board. Accordingly, electrical reliability of the light emitting diodes is degraded.

However, the light emitting diode package 30 according to the embodiment of the present invention vertically discharges heat through the heat sink 33 such that heat radiated from an individual light emitting diode is not conducted to other light emitting diodes. Accordingly, a heat dissipation efficiency relatively increases, and electrical characteristics of other light emitting diodes can be ensured.

In addition, although the printed circuit board 32 according to the embodiment of the present invention is more economical as compared with the metal-core printed circuit board, the printed circuit board according to the embodiment of the present invention has a superior heat dissipation characteristic.

Further, since a solder pad having superior heat conductivity is provided to the printed circuit board 32, the solder pad is interposed between the light emitting diode 31 and the printed circuit board 32 in order to efficiently cause heat conduction between the light emitting diode 31 and the printed circuit board 32.

FIGS. 3 to 5 are sectional views sequentially showing a method of fabricating the light emitting diode package 30 according to the present invention.

Referring to FIGS. 3 to 5, the printed circuit board 32 according to the embodiment of the present invention is formed with the insulating layer 321 by including plastic or insulating material of FR-4 as shown in FIG. 3. Then, after depositing or compressing a copper layer on one surface of the insulating layer 321, photoresist is coated on the upper surface of the resultant structure, and then a wet etching process is performed, thereby forming the circuit pattern 323.

A solder pad is provided to the circuit pattern 323 in an area, on which the light emitting diode 31 is mounted, in order to make contact with the electrode pad of the light emitting diode 31. Then, the through hole 322 is formed in an area separated from the solder pad by a predetermined distance and on which the light emitting diode is mounted.

Thereafter, as shown in FIG. 4, the light emitting diode 31 is mounted on the circuit pattern 323 of the printed circuit board 32.

In this case, metal plating available for a soldering process may have been performed on the solder pad, and gold or silver may be used as a plating material.

Then, as shown in FIG. 5, the heat sink 33 is inserted into the through hole 322 of the printed circuit board 32 such that the heat sink 33 makes surface contact with the bottom surface of the light emitting diode 31.

The heat sink 33 according to the embodiment of the present invention may be variously manufactured according to the thickness and the size of the printed circuit board 32. In addition, the heat sink 33 may be forcibly fitted into the through hole 322 formed on the printed circuit board 32 or fixed to the printed circuit board 32 by glue.

In this manner, a light emitting diode package having high heat dissipation characteristics can be manufactured by using a printed circuit board including the heat sink.

Meanwhile, as shown in FIG. 6, the manufactured light emitting diode package is mounted on a backlight unit which is a light source of an LCD.

A backlight unit 10 equipped with the light emitting diode package 30 according to the embodiment of the present invention includes a frame 13 for fixing and supporting the light emitting diode package 30 and optical sheets 15a, 15b, and 15c arranged between the light emitting diode package 30 and a liquid crystal (not shown).

The optical sheets 15a, 15b, and 15c prevent the shape of the light emitting diode package 30 from being reflected on a screen of the LCD, and are used for providing a light source allowing uniform brightness distribution. In addition, the optical sheets include a plurality of prism sheets 15b and 15c and a diffusion sheet 15a between a panel of the LCD and the light emitting diode package 30 in order to increase optical scattering.

The light emitting diode package 30 is mounted while making surface contact with the backlight unit support member 17 connected to the frame 13 of the backlight unit 10.

Accordingly, heat emitted from the light emitting diode package 30 is discharged to an exterior through the heat sink 33 and the backlight unit support member 17.

In other words, the light emitting diode package 30 according to the embodiment of the present invention delivers heat to a heat sink of the backlight unit 10 in order to absorb heat emitted from the light emitting diode through the heat sink 33 and discharge the heat to an exterior.

Hereinafter, a process of driving the backlight unit equipped with the light emitting diode package according to the present invention will be described.

If power is applied to the light emitting diode package 30 according to the embodiment of the present invention, and then supplied to the light emitting diode chip 312 through the lead frame, the light emitting diode chip 312 generates light having an intrinsic wavelength.

For example, four R, G, G, B light emitting diode chips 312 may be mounted on the chip support member 311 such that the light emitting diode 31 generates white light having high brightness. In this case, the light emitting diode chips 312 are connected to each other through resistors in parallel or in series.

Since the light emitting diode chips 312 emit light having different brightness, the intensity and the brightness of the emitted light are controlled by verifying each resistance ratio so as to adjust current flowing in the four light emitting diode chips 312.

Light emitted from the individual light emitting diode chip 312 is radially scattered while changing light paths, and then is emitted to an exterior by passing through an outer surface of the package molding part 314. As the light emitting diode 31 emits light as described above, heat is generated.

The heat generated from the individual light emitting diode 31 is delivered to the printed circuit board 32 through the chip support member 311. Then, the heat delivered to the printed circuit board 32 may be discharged through the heat sink 33.

As described above, the printed circuit board 32 according to the embodiment of the present invention has a heat dissipation characteristic superior to that of a heat dissipation substrate of an existing metal core printed circuit board, and cooling time is short, so that the printed circuit board 32 may be used in various types of fields employing a high-brightness and high-power light emitting diode.

In addition, the light emitting diode is mounted on the printed circuit board having superior heat discharging efficiency, so that it is possible to improve optical power efficiency of the light emitting diode and simplify a manufacturing process of the light emitting diode package.

As described above, according to the embodiment of the present invention, a heat dissipation effect of a light emitting diode package is maximized, thereby continuously emitting light and maintaining a predetermined temperature even when the optical power of the light emitting diode increases. Accordingly, it is possible to prevent chromaticity coordinates, a peak wavelength, and a full width at half maximum (FWHM) from changing due to the change of temperature.

In addition, according to the embodiment of the present invention, a through hole is formed in the typical printed circuit board in order to insert a heat sink into the through hole, thereby efficiently realizing a high-brightness light emitting diode package having a superior light emitting effect. Accordingly, a manufacturing process of the light emitting diode package is simplified such that it is possible to improve the productivity of the package, and lower manufacturing costs of the package.

Besides, the degradation of a light emitting characteristic of a light emitting diode caused by heat can be overcome, and surface light emitting can be realized in an LCD by using the light emitting diode. Accordingly, it is possible to realize a thin LCD.

Further, if a metal-core printed circuit board having a superior heat discharging characteristic is used, since heat generated from the light emitting diode may be delivered to the entire surface of the printed circuit board. Accordingly, heat is conducted to other light emitting diodes mounted on the printed circuit board, so that electrical reliability of light emitting diodes can be degraded. However, since a light emitting diode package according to the embodiment of the present invention vertically discharges heat through a heat sink, the light emitting diode package does not exert an influence on other light emitting diodes.

It will be apparent to those skilled in the art that various modifications and variations can be made in the present invention. Thus, it is intended that the present invention covers the modifications and variations thereof within the scope of the appended claims.

INDUSTRIAL APPLICABILITY

The present invention is variously adaptable for light sources of electric appliances employing a light emitting diode.

The invention claimed is:

1. A light emitting diode package, comprising:
a light emitting diode part comprising a light emitting diode chip, a lead frame electrically connected to the light emitting diode chip, a chip support member separate from the lead frame and supporting the light emitting diode chip, and a molding part molding the light emitting diode chip;
a printed circuit board provided with a circuit pattern configured to drive the light emitting diode chip and a through hole formed in an area where the light emitting diode part is mounted,
wherein the printed circuit board is disposed under the chip support member;
an electrical connection part disposed between the lead frame and the circuit pattern and configured to electrically connect the lead frame to the circuit pattern of the printed circuit board; and
a heat sink provided in the through hole and contacted with a bottom surface of the chip support member,
wherein an upper portion of the heat sink is protruded from the through hole, and
wherein a top surface of the printed circuit board is spaced from a lower surface of the chip support member.

2. The light emitting diode package according to claim 1, wherein the heat sink includes metal or metal paste.

3. The light emitting diode package according to claim 1, wherein heat conductive glue is provided between the chip support member and the heat sink.

4. The light emitting diode package according to claim 1, wherein the heat sink adheres to the through hole of the printed circuit board by glue.

5. The light emitting diode package according to claim 1, wherein the lead frame is formed on a top surface, a side surface, and a bottom surface of the chip support member.

6. The light emitting diode package according to claim 1, wherein the lead frame is electrically connected to a circuit pattern separated from the through hole by a distance.

7. A backlight unit, comprising:
a light emitting diode package which includes
a light emitting diode part comprising a light emitting diode chip, a lead frame electrically connected to the light emitting diode chip, a chip support member separate from the lead frame and supporting the light emitting diode chip, and a molding part molding the light emitting diode chip,
a printed circuit board provided with a circuit pattern configured to drive the light emitting diode chip and a through hole formed in an area on which the light emitting diode part is mounted,
an electrical connection part disposed between the lead frame and the circuit pattern and configured to electrically connect the lead frame to the circuit pattern of the printed circuit board, and
a heat sink provided in the through hole and contacted with a bottom surface of the chip support member,
wherein the printed circuit board is disposed under the chip support member;
a frame which supports the light emitting diode package such that heat delivered from the heat sink is discharged to an exterior; and
an optical sheet which transmits light emitted from the light emitting diode package,
wherein an upper portion of the heat sink is protruded from the through hole, and
wherein a top surface of the printed circuit board is spaced from a lower surface of the chip support member.

8. The backlight unit according to claim 7, wherein the heat sink includes metal or metal paste.

9. The backlight unit according to claim 7, wherein heat conductive glue is provided between the chip support member and the heat sink.

10. The backlight unit according to claim 7, wherein the heat sink adheres to the through hole of the printed circuit board by glue.

11. The backlight unit according to claim 7, wherein the lead frame is formed on a top surface, a side surface, and a bottom surface of the chip support member.

12. The backlight unit according to claim 7, wherein the lead frame is electrically connected to the circuit pattern separated from the through hole by a distance.

13. The light emitting diode package according to claim 1, wherein the light emitting diode chip comprises a red light emitting diode chip, a blue light emitting diode chip, and a green light emitting diode chip.

14. The backlight unit according to claim 7, wherein the light emitting diode chip comprises a red light emitting diode chip, a blue light emitting diode chip, and a green light emitting diode chip.

15. A light emitting diode package, comprising:
a light emitting diode part comprising a plurality of light emitting diode chips, a plurality of lead frames, wherein each of the plurality of lead frames is electrically connected to at least one of the plurality of light emitting diode chips, a chip support member separate from the plurality of lead frames and supporting the plurality of light emitting diode chips, and a molding part molding the plurality of light emitting diode chips;
a printed circuit board provided with a circuit pattern configured to drive the light emitting diode part and a through hole formed in an area where the light emitting diode part is mounted,
wherein the printed circuit board is disposed under the chip support member;
an electrical connection part disposed between the lead frame and the circuit pattern and configured to electrically connect the lead frame to the circuit pattern of the printed circuit board; and
a heat sink provided in the through hole and contacted with a bottom surface of the chip support member,
wherein an upper portion of the heat sink protruded from the through hole,
wherein a top surface of the printed circuit board is spaced from a lower surface of the chip support member,
wherein the through hole is located under the light emitting diode part, and
wherein a bottom surface of the light emitting diode part is larger than an upper area of the through hole.

16. The light emitting diode package according to claim 15, wherein the heat sink has a thickness thicker than the printed circuit board, and wherein a lower surface of the heat sink is formed on a same horizontal plane with a lower surface of the printed circuit board.

17. The light emitting diode package according to claim 1, wherein the through hole is located under the light emitting diode part.

18. The light emitting diode package according to claim 1, wherein a bottom surface of the light emitting diode part is larger than an upper area of the through hole.

19. The light emitting diode package according to claim 15, wherein the lead frame is formed on a top surface, a side surface and a bottom surface of the chip support member.

\* \* \* \* \*